US012713927B2

(12) United States Patent
Xiong et al.

(10) Patent No.: US 12,713,927 B2
(45) Date of Patent: Aug. 18, 2026

(54) REINFORCEMENT STRUCTURE AND ELECTRONIC DEVICE

(71) Applicant: Huawei Technologies Co., Ltd., Shenzhen (CN)

(72) Inventors: Zhenxing Xiong, Dongguan (CN); Wangliang Liu, Dongguan (CN); Zengqi Lan, Dongguan (CN); Caijun Zhao, Dongguan (CN); Xiang Xu, Nanjing (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 459 days.

(21) Appl. No.: 18/317,474

(22) Filed: May 15, 2023

(65) Prior Publication Data

US 2023/0290743 A1 Sep. 14, 2023

Related U.S. Application Data

(63) Continuation of application No. PCT/CN2021/110988, filed on Aug. 5, 2021.

(30) Foreign Application Priority Data

Nov. 16, 2020 (CN) ......................... 202011278972.9
Jan. 6, 2021 (CN) ......................... 202110013955.0

(51) Int. Cl.
*H10W 42/00* (2026.01)
*H05K 1/02* (2006.01)
(Continued)

(52) U.S. Cl.
CPC .......... *H10W 42/121* (2026.01); *H05K 1/023* (2013.01); *H05K 1/0271* (2013.01);
(Continued)

(58) Field of Classification Search
CPC ... H01L 23/552; H01L 23/556; H01L 23/562; H01L 23/40; H01L 23/4037;
(Continued)

(56) References Cited

U.S. PATENT DOCUMENTS 9,508,683 B1 * 11/2016 Choi ..................... H01L 23/552
2011/0317386 A1 * 12/2011 Kawabata ............. H05K 3/368
361/772

(Continued)

FOREIGN PATENT DOCUMENTS

CN 2681351 Y 2/2005
CN 101174611 A 5/2008

(Continued)

*Primary Examiner* — Zandra V Smith
*Assistant Examiner* — Douglas Yap
(74) *Attorney, Agent, or Firm* — Slater Matsil, LLP

(57) ABSTRACT

This application relates to the field of chip technologies, and provides a reinforcement structure and an electronic device. The reinforcement structure includes a support frame, an accommodation chamber, and an electromagnetic radiation suppression structure. The accommodation chamber is provided on the support frame and runs through a first surface and a second surface of the support frame that are opposite to each other. The accommodation chamber is used for accommodating a chip package structure disposed on a printed circuit board. A wall surface that is of the support frame and that defines the accommodation chamber is an inner surface, and a wall surface of the support frame opposite to the inner surface is an outer surface. The electromagnetic radiation suppression structure is disposed on at least one of the first surface, the second surface, the inner surface, and the outer surface.

19 Claims, 9 Drawing Sheets

(51) Int. Cl.

| | |
|---|---|
| ***H10W 40/20*** | (2026.01) |
| ***H10W 40/60*** | (2026.01) |
| ***H10W 42/20*** | (2026.01) |
| ***H10W 70/40*** | (2026.01) |

(52) U.S. Cl.

CPC ........... *H10W 40/60* (2026.01); *H10W 42/20* (2026.01); *H10W 70/479* (2026.01); *H10W 40/242* (2026.01)

(58) Field of Classification Search

CPC ............... H01L 23/405; H01L 23/4056; H01L 23/4062; H01L 23/4068; H05K 1/0216; H05K 1/0271; H05K 1/023–0234; H05K 1/0218; H05K 2201/10371; H05K 2201/10424; H05K 2201/2018; H10W 42/121; H10W 42/20; H10W 40/242; H10W 40/60; H10W 70/479; H10W 70/614; H10W 76/614

See application file for complete search history.

(56) References Cited

U.S. PATENT DOCUMENTS

| | | | | |
|---|---|---|---|---|
| 2014/0078677 | A1 | 3/2014 | Dolci et al. | |
| 2014/0268578 | A1 | 9/2014 | Dolci et al. | |
| 2017/0127523 | A1* | 5/2017 | Fritz | H05K 1/0216 |
| 2017/0330814 | A1* | 11/2017 | Kang | H10W 74/117 |
| 2019/0051615 | A1* | 2/2019 | Nair | H10W 42/20 |
| 2019/0074252 | A1* | 3/2019 | Chigullapalli | H10W 42/20 |
| 2019/0122993 | A1 | 4/2019 | Kim et al. | |
| 2020/0194382 | A1 | 6/2020 | Tsai et al. | |

FOREIGN PATENT DOCUMENTS

| | | | |
|---|---|---|---|
| CN | 101322245 | A | 12/2008 |
| CN | 101673733 | A | 3/2010 |
| CN | 103943610 | A | 7/2014 |
| CN | 102779811 | B | 2/2015 |
| CN | 106169463 | A | 11/2016 |
| CN | 106937521 | A | 7/2017 |
| CN | 107105596 | A | 8/2017 |
| CN | 108369939 | A | 8/2018 |
| CN | 108431946 | A | 8/2018 |
| CN | 110444539 | A | 11/2019 |
| WO | 2016058182 | A1 | 4/2016 |

* cited by examiner

REINFORCEMENT STRUCTURE AND ELECTRONIC DEVICE

CROSS-REFERENCE TO RELATED APPLICATIONS

This application is a continuation of International Application No. PCT/CN2021/110988, filed on Aug. 5, 2021, which claims priority to Chinese Patent Application No. 202011278972.9, filed on Nov. 16, 2020, and to Chinese Patent Application No. 202110013955.0, filed on Jan. 6, 2021. All of the aforementioned patent applications are hereby incorporated by reference in their entireties.

TECHNICAL FIELD

This application relates to the field of chip technologies, and in particular, to a reinforcement structure and an electronic device.

BACKGROUND

With evolution of chip rates from 10 Gbps to 25 Gbps and then to 56 Gbps, electromagnetic noise radiated by a chip package structure keeps increasing. Currently, electromagnetic noise of a chip with a rate of 56 Gbps has exceeded a limit value of 8 dB.

Generally, a chip package structure is integrated on a printed circuit board (PCB). As a size of the chip package structure increases, it is increasingly difficult to control thermal deformation of a package due to coefficient of thermal expansion (CTE) mismatch between the chip package structure and the PCB. As the thermal deformation of the package increases, large warpage is directly caused in a structure including the chip package structure and the PCB, or even a crack is caused in a solder ball that connects the chip package structure and the PCB.

Therefore, currently, in a PCB integrated with a chip package structure with a large size and high power consumption, suppression of electromagnetic noise in the chip package structure and control of thermal deformation of a package are common technical problems in this field.

SUMMARY

This application provides a reinforcement structure and an electronic device, to provide a reinforcement structure that can suppress electromagnetic noise, reduce thermal deformation of a package, and suppress a degree of warpage.

To achieve the foregoing objective, the following technical solutions are used in this application.

According to a first aspect, this application provides a reinforcement structure. The reinforcement structure includes a support frame, an accommodation chamber, and an electromagnetic radiation suppression structure. The accommodation chamber is provided on the support frame, and runs through a first surface and a second surface that are opposite to each other. The accommodation chamber is used for accommodating a chip package structure disposed on a printed circuit board. A wall surface that is of the support frame and that defines the accommodation chamber is an inner surface, and a wall surface of the support frame opposite to the inner surface is an outer surface. The electromagnetic radiation suppression structure is disposed on at least one of the first surface, the second surface, the inner surface, and the outer surface.

According to the reinforcement structure provided in this application, the reinforcement structure includes the support frame and the electromagnetic radiation suppression structure carried on a surface of the support frame. In this way, when the reinforcement structure is disposed on the printed circuit board and the chip package structure is located in the accommodation chamber, the reinforcement structure applies a force to the printed circuit board, so that degrees of warpage of a chip package substrate and the printed circuit board can be suppressed, to reduce a risk of a crack in a solder ball connecting the chip package structure and the printed circuit board, and eventually improve a product qualification rate.

In addition, because the electromagnetic radiation suppression structure is carried on the surface of the support frame, the electromagnetic radiation suppression structure suppresses an electromagnetic wave radiated by the chip package structure. Therefore, the reinforcement structure has both a function of suppressing electromagnetic radiation and a function of suppressing warpage.

In a possible implementation of the first aspect, the electromagnetic radiation suppression structure is disposed on the inner surface and/or the outer surface, and a part of the electromagnetic radiation suppression structure close to the first surface protrudes from the first surface.

When the reinforcement structure is disposed on the printed circuit board, especially when the support frame is made of a metal material, a metal wiring is generally arranged on a surface of the printed circuit board. To avoid electrical conduction between the metal support frame and the metal wiring on the printed circuit board, an insulation layer may be arranged at a position of the printed circuit board in contact with the first surface of the support frame, and the support frame is then disposed on the insulation layer, so that the support frame is insulated from the printed circuit board. However, the insulation layer generally has no electromagnetic radiation suppression function. Therefore, in this application, a part of the electromagnetic radiation suppression structure close to the first surface protrudes from the first surface, to use the protruding part of the electromagnetic radiation suppression structure to keep electromagnetic radiation from leaking from the insulation layer. This enhances an electromagnetic radiation suppression effect.

In a possible implementation of the first aspect, a concave cavity is formed in a partial area of the first surface, the electromagnetic radiation suppression structure is arranged in the concave cavity, and the electromagnetic radiation suppression structure protrudes from the concave cavity.

In other words, when the first surface is close to the printed circuit board, the concave cavity is formed in the partial area of the first surface, and an area that is not provided with the concave cavity is connected to the printed circuit board by the insulation layer. In this way, on the premise that electromagnetic radiation is kept from leaking from the insulation layer, a size of the reinforcement structure can be reduced, and a reinforcement structure with a large size is kept from occupying an installation position of another module on the PCB.

In a possible implementation of the first aspect, the electromagnetic radiation suppression structure is disposed on the second surface, and an electromagnetic radiation suppression structure is at least disposed at positions of the inner surface and the outer surface close to the second surface.

In practice, most electromagnetic waves radiated by the chip package structure are radiated through a position close to a heat sink. In this application, when the second surface is disposed closer than the first surface to the heat sink, the electromagnetic radiation suppression structure is disposed on the second surface and is at least disposed at positions of the inner surface and the outer surface close to the second surface, so that the electromagnetic radiation suppression effect can be improved.

In a possible implementation of the first aspect, the support frame is made of a metal material. The support frame is made of a metal material. Based on suppressing warpage and reducing a deformation, the metal support frame further blocks the electromagnetic wave radiated by the chip package structure, to further enhance the electromagnetic radiation suppression effect.

In a possible implementation of the first aspect, the electromagnetic radiation suppression structure is made of an electromagnetic shielding material, to form a shield layer.

In a possible implementation of the first aspect, the electromagnetic radiation suppression structure is made of an electromagnetic wave-absorbing material, to form a wave-absorbing layer.

In a possible implementation of the first aspect, the wave-absorbing layer is adhered to the support frame by a bonding layer. Alternatively, the electromagnetic wave-absorbing material is coated on the support frame to form the wave-absorbing layer.

The wave-absorbing layer is formed on the support frame in the foregoing assembly manner, and the manufacturing process is simple and easy to implement.

In a possible implementation of the first aspect, the electromagnetic radiation suppression structure further includes a metal layer and a plurality of metal posts. The plurality of metal posts are arranged on a side of the metal layer, an end of each metal post is connected to the metal layer, and a gap exists between every two adjacent metal posts.

In a possible implementation of the first aspect, a height of the reinforcement structure is larger than or equal to a height of the chip package structure. The height is a size in a direction from the first surface to the second surface.

In this way, after the reinforcement structure is disposed on the printed circuit board, the chip package structure is located in a closed cavity defined by the reinforcement structure, the heat sink, and the printed circuit board, to further reduce a radiation path of an electromagnetic wave and enhance an electromagnetic wave suppression effect.

According to a second aspect, this application provides an electronic device. The electronic device includes a printed circuit board, a chip package structure, a reinforcement structure, and a heat sink. The reinforcement structure is the reinforcement structure in any implementation of the first aspect. The chip package structure and the reinforcement structure are integrated on a same surface of the printed circuit board, and the chip package structure is located in an accommodation chamber. The heat sink covers a side of the chip package structure away from the printed circuit board.

The electronic device provided in this application includes the reinforcement structure according to any one of the implementations of the first aspect. In this way, the electromagnetic radiation suppression structure in the reinforcement structure suppresses an electromagnetic wave radiated by the chip package structure. In addition, the reinforcement structure can suppress a degree of warpage of the chip package substrate and the printed circuit board, thereby reducing a risk of a crack in a solder ball used for connecting the chip package structure and the printed circuit board. This improves a qualification rate of the electronic device.

In a possible implementation of the second aspect, the first surface is close to the printed circuit board, an insulation layer is arranged at a position of the printed circuit board in contact with the first surface, an electromagnetic radiation suppression structure is disposed on an inner surface and/or an outer surface, and a part of the electromagnetic radiation suppression structure close to the first surface protrudes from the first surface.

The insulation layer is disposed, so that the support frame can be kept from being electrically connected to the metal wiring on the printed circuit board, and the electromagnetic radiation suppression structure that is on the inner surface and/or the outer surface and that protrudes from the first surface can stop radiation of electromagnetic radiation from the insulation layer.

In a possible implementation of the second aspect, the first surface is close to the printed circuit board, a concave cavity is formed in the first surface, the electromagnetic radiation suppression structure is arranged in the concave cavity, the electromagnetic radiation suppression structure protrudes from the concave cavity, and an insulation layer is provided between the printed circuit board and an area that is of the first surface and that is not provided with the concave cavity.

In this way, on the premise that electromagnetic radiation is kept from leaking from the insulation layer, a size of the reinforcement structure can be reduced, and a reinforcement structure with a large size is kept from occupying an installation position of another module on the printed circuit board.

In a possible implementation of the second aspect, the support frame includes a plurality of support subframes, the plurality of support subframes are arranged at intervals along a periphery of the chip package structure, and a spacing between two adjacent support subframes is a quarter of a wavelength corresponding to a frequency of an electromagnetic wave to be suppressed.

In a possible implementation of the second aspect, a surface of the reinforcement structure facing the printed circuit board abuts against the printed circuit board, and a surface of the reinforcement structure facing the heat sink abuts against the heat sink, so that the chip package structure is located in a closed cavity defined by the reinforcement structure, the heat sink, and the printed circuit board. The chip package structure is defined in the closed cavity defined by the reinforcement structure, the heat sink, and the printed circuit board, so that a radiation path of an electromagnetic wave can be shortened, and the electromagnetic wave suppression effect can be enhanced.

In a possible implementation of the second aspect, the chip package structure includes: a package substrate and a chip. The package substrate is located on the printed circuit board. The chip is disposed on a surface of the package substrate. The heat sink covers a side of the chip away from the package substrate. In this way, a die chip package is formed.

In a possible implementation of the second aspect, the chip package structure includes a package substrate, a chip, and a lid. The package substrate is located on the printed circuit board. The chip is disposed on the surface of the package substrate. The lid covers a side of the chip away from the package substrate and is connected to the package substrate, and the heat sink covers the lid. In this way, a non-die chip package is formed.

REFERENCE NUMERALS

1—PCB; 2—chip package structure; 21—chip; 22—package substrate; 23—reinforcement ring; 24—lid; 3—electrical connection structure; 4—electronic component; 5—heat sink; 51—bump; 6—TIM layer; 7—reinforcement structure; 71—support frame; 72—electromagnetic radiation suppression structure; 73—mounting hole; 74—accommodation chamber; 711—support subframe; 81—metal layer; 82—metal post; 83—another metal layer; 84—wave—absorbing layer or shield layer; 9—insulation layer; and 10—concave cavity.

DETAILED DESCRIPTION OF ILLUSTRATIVE EMBODIMENTS

An embodiment of this application provides an electronic device. The electronic device may be a server or a data center, may be a mobile phone, a pad, a smart wearable product (for example, a smartwatch or a smart band), a virtual reality (VR) device, or an augmented reality (AR) device, or may be a home appliance, or the like. A specific form of the electronic device is not specially limited in embodiments of this application.

Figure 1:
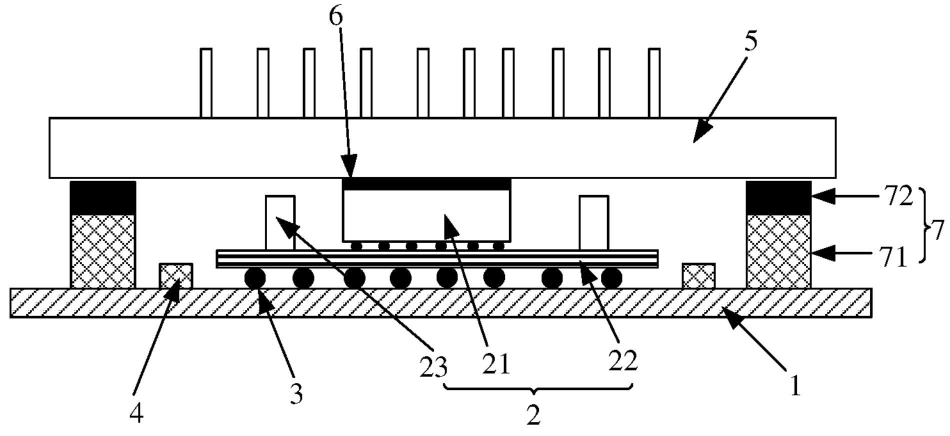
FIG. 1 is a schematic diagram of a partial structure of an electronic device according to an embodiment of this application.

FIG. 1 is a diagram of a partial structure of an electronic device. The electronic device includes a printed circuit board (PCB) 1 and a chip package structure 2. The chip package structure 1 is electrically connected to the PCB 1 by an electrical connection structure 3, so that the chip package structure 2 can be interconnected to another chip or another electronic component 4 (for example, a transistor, a diode, a resistor, a capacitor, or an inductor) on the PCB 1. In an optional implementation, the electrical connection structure 3 may be a ball grid array (ball grid array, BGA).

The electronic device shown in FIG. 1 further includes a heat sink 5. The heat sink 5 covers a side of the chip package structure 2 away from the PCB 1, and is fastened to the PCB 1 by a connecting member (not shown in the figure). The heat sink 5 may be of a fin-shaped structure shown in FIG. 1, or may be another structure.

The chip package structure 2 of the electronic device shown in FIG. 1 includes a chip 21 and a package substrate 22. The chip 21 is integrated on a surface of the package substrate 22. The heat sink 5 of the electronic device covers an upper surface of the chip 21 through a thermal interface material (TIM) layer 6. In this way, heat dissipated by the chip 21 is conducted to the heat sink 5 through the TIM 6. The heat sink 5 having a large heat conduction area diffuses the heat to cool the chip 21 and ensure normal running of the chip 21, and has a better heat dissipation especially for a chip having high power consumption or a plurality of stacked chips. Such a package form may be referred to as a die package.

In the die package in FIG. 1, to suppress large warpage of the chip 21 and the package substrate 22 caused by thermal deformation, a reinforcement ring 23 is further disposed on the package substrate 22, and the reinforcement ring 23 surrounds a periphery of the chip 21.

Figure 2:
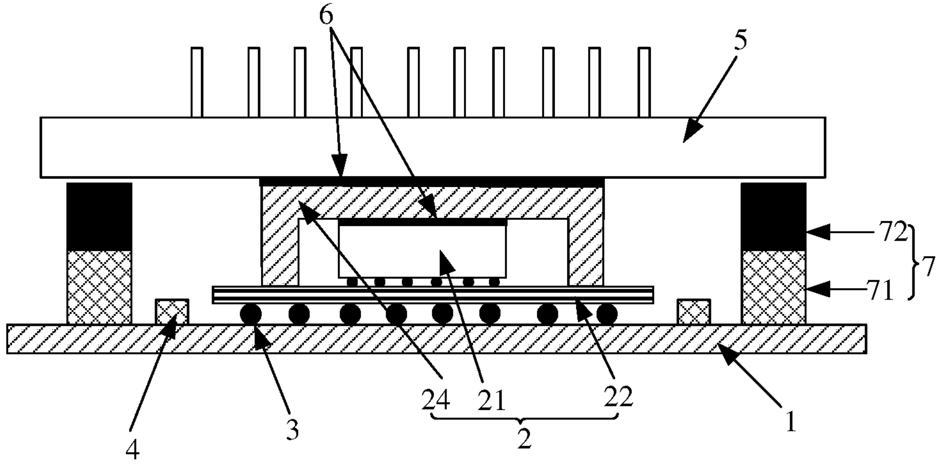
FIG. 2 is a schematic diagram of a partial structure of an electronic device according to an embodiment of this application.

FIG. 2 is a schematic diagram of a partial structure of another electronic device. A difference from the electronic device shown in FIG. 1 in that the chip package structure 2 of the electronic device includes a lid 24. The lid 24 covers the upper surface of the chip 21 through the TIM layer 6. The heat sink 5 covers a surface of the lid 24 through the TIM layer 6, and the lid 24 is fastened to the package substrate 22. Such a package form may be referred to as a non-die package.

The lid 24 shown in FIG. 2 has an effect of suppressing warpage of the chip 21 and the package substrate 22 and can dissipate heat for the chip 21.

In FIG. 1 and FIG. 2, as power consumption of the chip 21 increases, after electromagnetic noise radiated by the chip 21 is amplified by the package substrate 22, the lid 24, or the electrical connection structure 3, radiation noise of the chip package structure 2 is continuously increased. In addition, with application of a plurality of stacked chips, a size of the chip package structure 2 keeps increasing. In this way, when the chip package structure 2 with a large size is soldered to the PCB via the BGA, large warpage tends to occur between the chip package structure and the PCB due to a CTE mismatch between the chip package structure 2 and the PCB 1, or sometimes a crack occurs in the BGA, or a short circuit occurs as two adjacent BGAs are in contact.

Refer to FIG. 1 and FIG. 2. The electronic device further includes a reinforcement structure 7 to enhance suppression of radiation noise of the chip package structure 2 and control large thermal deformation of the chip package structure 2 and the PCB 1. The reinforcement structure 7 is disposed on the PCB 1, and is on a same surface as the chip package structure 2.

A detailed structure of the reinforcement structure 7 and a produced effect thereof are described below.

Figure 3:
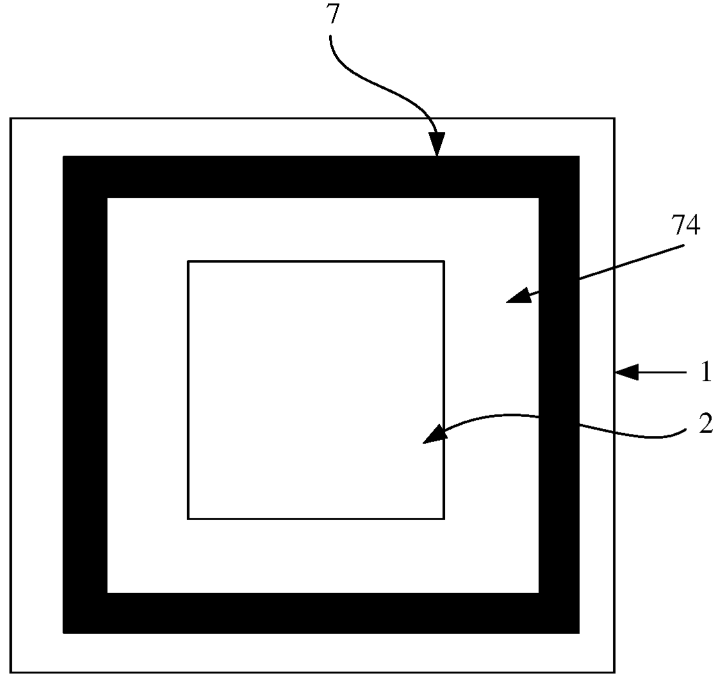
FIG. 3 is a top view of an electronic device according to an embodiment of this application.
Figure 4:
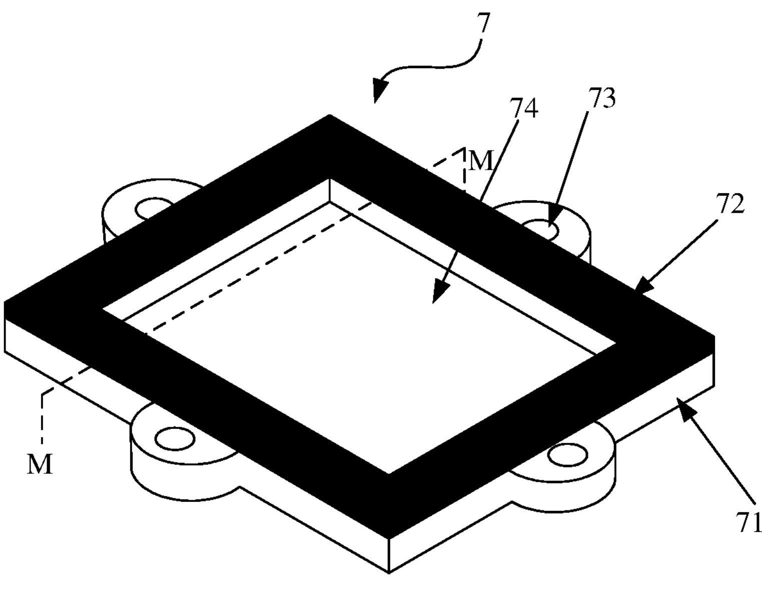
FIG. 4 is a three-dimensional schematic diagram of a reinforcement structure according to an embodiment of this application.

FIG. 3 and FIG. 4 are structural diagrams of a reinforcement structure 7. The reinforcement structure 7 includes an electromagnetic radiation suppression structure 72 and a support frame 71. An accommodation chamber 74 is provided on the support frame 71. The accommodation chamber 74 is used for accommodating the chip package structure 2 disposed on the printed circuit board 1. In other words, the chip package structure 2 is located in the accommodation chamber 74. The support frame 71 surrounds a periphery of the chip package structure 2.

Figure 5:
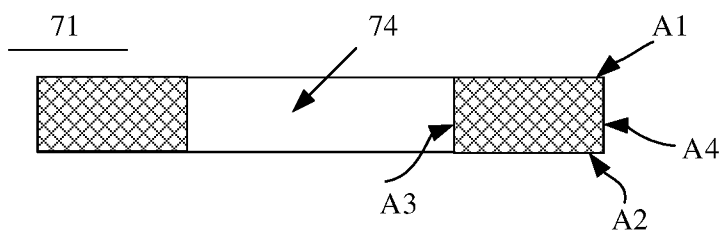
FIG. 5 is a sectional view of a support frame according to an embodiment of this application.

FIG. 5 is a sectional view of the support frame 71 cut in a sectional direction M-M in FIG. 4. The support frame 71 has a first surface A1 (e.g., a top surface) and a second surface A2 (e.g., a bottom surface) that are opposite to each other, an inner surface A3 (e.g., a side surface) that defines the accommodation chamber 74, and an outer surface A4 (e.g., a side surface) that is opposite to the inner surface A3.

The electromagnetic radiation suppression structure 72 may be disposed on at least one of the first surface A1, the second surface A2, the inner surface A3, and the outer surface A4 of the support frame 71. For example, FIG. 1 and FIG. 2 show that the electromagnetic radiation suppression structure 72 is disposed on only one surface.

Because the reinforcement structure 7 includes the support frame 71, when the reinforcement structure 7 is arranged along the periphery of the chip package structure 2, a force is applied to the PCB 1, so that degrees of warpage of the chip package structure 2 and the PCB 1 can be suppressed, thermal deformation thereof is reduced, a risk of crack in a BGA is reduced, and a qualification rate of the electronic device is improved.

In addition, because the electromagnetic radiation suppression structure 72 is disposed on the at least one surface of the support frame 71, after being radiated to the electromagnetic radiation suppression structure 72, an electromagnetic wave radiated by the chip package structure 2 is suppressed by the electromagnetic radiation suppression structure 72, to reduce radiation noise of the electromagnetic wave of the chip package structure.

Therefore, the reinforcement structure 7 integrated on the PCB 1 provided in embodiments of this application has both a function of suppressing warpage of the PCB 1 and the chip package structure 2 and a function of suppressing electromagnetic wave radiation. To be specific, one structure has two functions, and especially has high use performance for structures in FIG. 1 and FIG. 2 with small sizes.

The reinforcement structure 7 is fastened relative to the PCB 1. For example, as shown in FIG. 4, a mounting hole 73 may be provided in the reinforcement structure 7, and a fastener (for example, a screw) is passed through the mounting hole 73, to fasten the reinforcement structure 7 to the PCB 1. Because the PCB 1 and the reinforcement structure 7 have large sizes, compared with using an adhesive layer, using the fastener has higher connection strength and more reliable connection stability.

When the reinforcement structure 7 is fastened to the PCB 1 by the fastener, to avoid warpage of the PCB 1 caused by fastening of the fastener, connection positions between the fastener and the PCB 1 may be symmetrically arranged with respect to a center of the PCB 1.

Figure 6A:
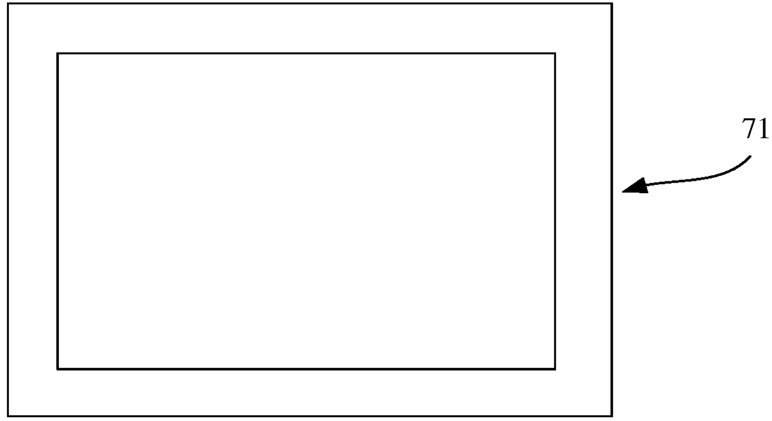
FIG. 6*a* is a schematic diagram of a structure of a support frame according to an embodiment of this application.
Figure 6B:
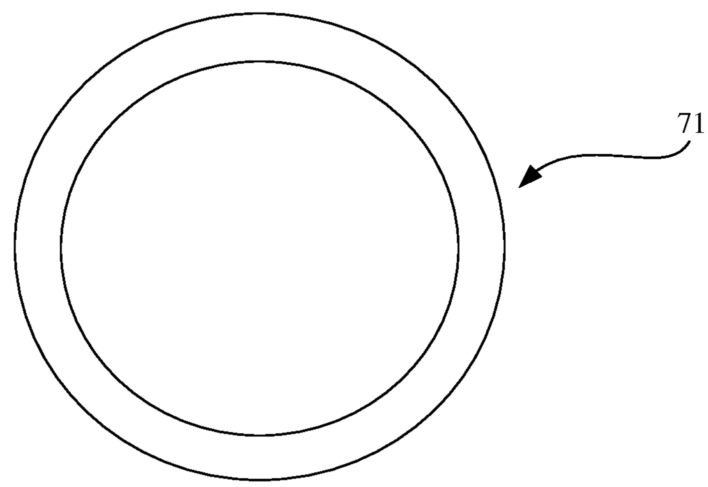
FIG. 6*b* is a schematic diagram of a structure of a support frame according to an embodiment of this application.
Figure 6C:
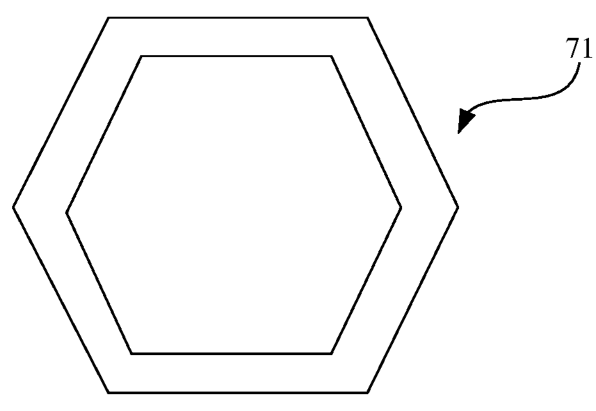
FIG. 6*c* is a schematic diagram of a structure of a support frame according to an embodiment of this application.

The support frame 71 has a plurality of different structures. For example, as shown in FIG. 6*a*, the support frame 71 may be of a rectangular ring structure. In another example, as shown in FIG. 6*b*, the support frame 71 may be of a circular ring structure. In another example, as shown in FIG. 6*c*, the support frame 71 may be of a polygonal (for example, hexagonal) ring structure.

Figure 6D:
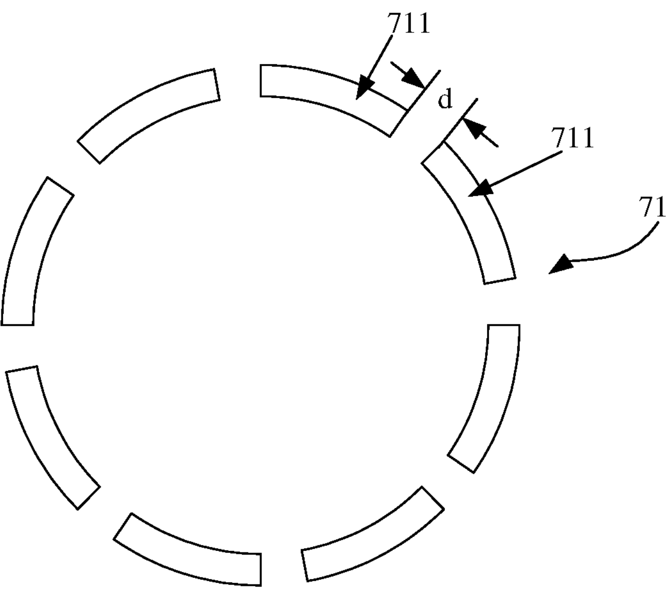
FIG. 6*d* is a schematic diagram of a structure of a support frame according to an embodiment of this application.

In addition, the support frame 71 may also be shown in FIG. 6*d*. The support frame 71 includes a plurality of support subframes 711. The plurality of support subframes 711 are arranged at intervals along the periphery of the chip package structure, and a spacing d between every two adjacent support subframes 711 is a quarter of a wavelength corresponding to a frequency of an electromagnetic wave to be suppressed. In this way, electromagnetic radiation of a corresponding frequency can be suppressed.

It is to be noted that when the foregoing spacing d is a quarter of the wavelength corresponding to the frequency of the electromagnetic wave to be suppressed, the spacing d may be completely equal to a quarter of the wavelength corresponding to the frequency of the electromagnetic wave to be suppressed, or the spacing d may be close to a quarter of the wavelength corresponding to the frequency of the electromagnetic wave to be suppressed.

Several different structures of the electromagnetic radiation suppression structure 72 are provided below.

In some implementations, the electromagnetic radiation suppression structure 72 includes a wave-absorbing layer made of an electromagnetic wave-absorbing material. The electromagnetic wave-absorbing material is a type of material that can absorb energy of an electromagnetic wave emitted to a surface thereof, for example, a rubber-based wave-absorbing material, a resin-based wave-absorbing material, or a foam-based wave-absorbing material.

In some other implementations, the electromagnetic radiation suppression structure 72 may include a shield layer made of an electromagnetic shielding material. The electromagnetic shielding material is a type of material that can perform metal isolation between two spatial areas, to control induction and radiation of an electric field, a magnetic field, and an electromagnetic wave from one area to another area, for example, a conductive sponge, a conductive adhesive strip, or a shielding spring sheet.

When the electromagnetic radiation suppression structure 72 is the wave-absorbing layer, the wave-absorbing layer may be adhered to the support frame 71 by a bonding layer. Alternatively, the electromagnetic shielding material may be coated on the support frame and cured to form the wave-absorbing layer on the support frame.

Figure 7A:
FIG. 7*a* is a cross-sectional view of a wave-absorbing layer or a shield layer according to an embodiment of this application.
Figure 7B:
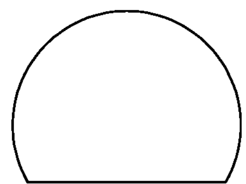
FIG. 7*b* is a cross-sectional view of a wave-absorbing layer or a shield layer according to an embodiment of this application.
Figure 7C:
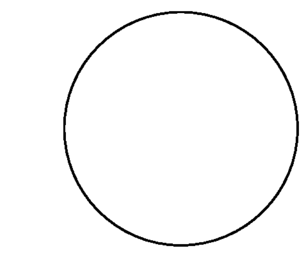
FIG. 7*c* is a cross-sectional view of a wave-absorbing layer or a shield layer according to an embodiment of this application.

When the electromagnetic radiation suppression structure 72 is the wave-absorbing layer or the shield layer, a cross-section of the wave-absorbing layer or the shield layer may be of a rectangular structure shown in FIG. 7*a*, a sector structure shown in FIG. 7*b*, or a circular structure shown in FIG. 7*c*. Certainly, the cross-section may be of another structure.

Figure 8:
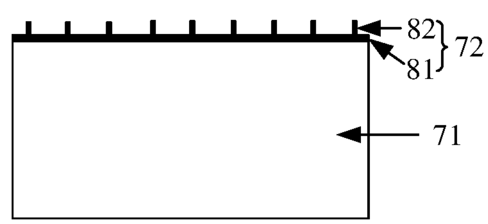
FIG. 8 is a schematic diagram of a structure including a support frame and an electromagnetic radiation suppression structure according to an embodiment of this application.
Figure 9:
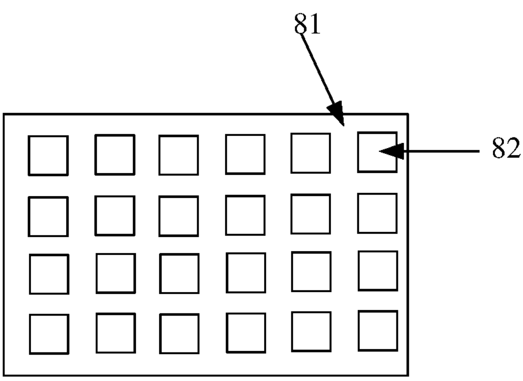
FIG. 9 is a schematic diagram of a structure of an electromagnetic radiation suppression structure according to an embodiment of this application.

In some other implementations, FIG. 8 is a structural diagram of another electromagnetic radiation suppression structure 72. The electromagnetic radiation suppression structure 72 includes a metal layer 81 and a plurality of metal posts 82. The metal layer 81 is carried on the support frame 71. FIG. 9 is a top view of the electromagnetic radiation suppression structure 72 in FIG. 8. The plurality of metal posts 82 are disposed on a side of the metal layer 81 away from the support frame 71. One end of each metal post 82 is connected to the metal layer 81. A gap exists between every two adjacent metal posts 82.

Figure 10:
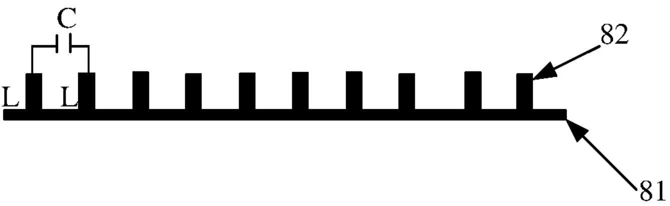
FIG. 10 is a diagram of an electromagnetic radiation suppression principle of an electromagnetic radiation suppression structure according to an embodiment of this application.

An electromagnetic radiation suppression principle in FIG. 8 and FIG. 9 is shown in FIG. 10. The metal posts 82 may be considered as inductors L. A capacitive coupling C exists between two adjacent metal posts 82. An LC circuit connected in parallel has large impedance at a resonance frequency, to suppress propagation of a current. Because the current cannot spread to an edge of the metal layer 81 and continue to radiate to free space, the structure has an electromagnetic radiation suppression effect.

Shielding against different resonance frequencies can be implemented by changing the inductance value L and the capacitance value C. During specific implementation, the inductance or the capacitance can be changed by changing sizes (for example, heights and cross-sectional areas) of the metal posts or by changing a spacing between two adjacent metal posts 82.

In some implementations, to suppress electromagnetic signals of a plurality of resonance frequencies, heights and cross-sectional areas of the plurality of metal posts 82 or the spacing between two adjacent metal posts may be set to be different, so that a plurality of resonance points can be generated. In this way, electromagnetic radiation suppression of a plurality of frequency bands or a wide frequency band can be formed.

Figure 11:
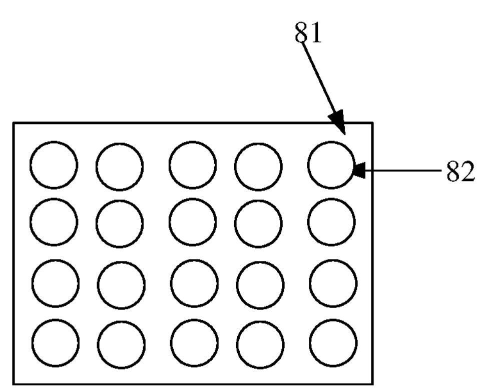
FIG. 11 is a schematic diagram of a structure of an electromagnetic radiation suppression structure according to an embodiment of this application.

FIG. 11 is a structural diagram of another electromagnetic radiation suppression structure. A difference from the structure shown in FIG. 9 is that the cross-section of the metal post 82 in FIG. 11 is a circle, and the cross-section of the metal post 82 shown in FIG. 9 is a polygon. A specific shape of the metal post is not specially limited in this application.

Figure 12:
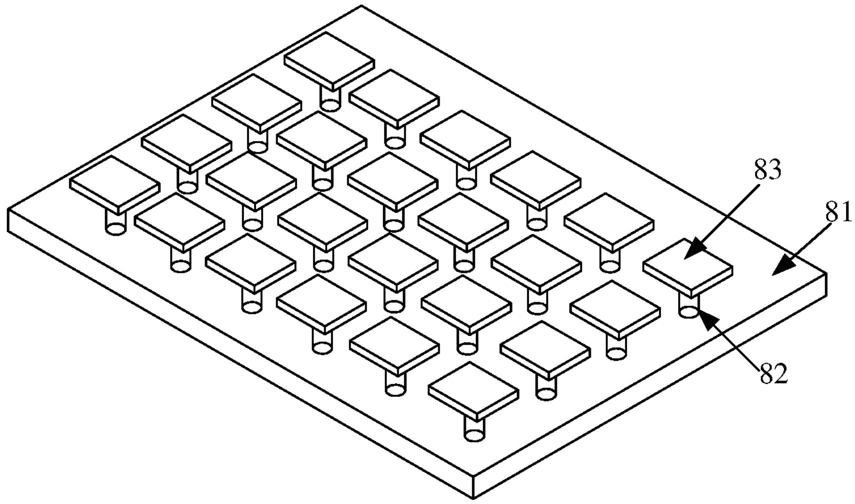
FIG. 12 is a schematic diagram of a structure of an electromagnetic radiation suppression structure according to an embodiment of this application.
Figure 13:
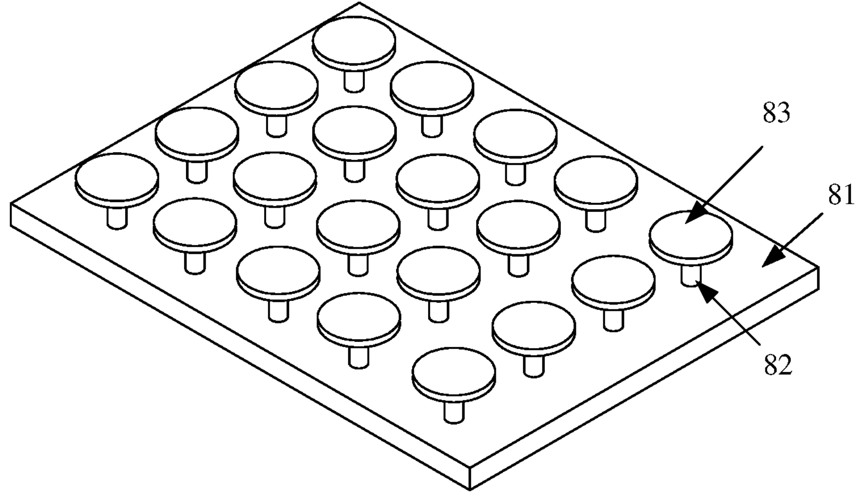
FIG. 13 is a schematic diagram of a structure of an electromagnetic radiation suppression structure according to an embodiment of this application.

FIG. 12 and FIG. 13 further provide structural diagrams of two other electromagnetic radiation suppression structures. A difference from FIG. 1*i* and FIG. 9 is that another metal layer 83 is further included. The another metal layer 83 is disposed at an end of the metal post 82 away from the metal layer 81.

Compared with the electromagnetic radiation suppression structures shown in FIG. 9 and FIG. 11, FIG. 12 and FIG. 13 have smaller sizes when suppression frequency bands are the same, and in this case are more applicable to a small-size chip package structure.

The electromagnetic radiation suppression structures shown in FIG. 9 and FIG. 11 may be prepared based on a semiconductor process. For example, a metal layer is deposited on the support frame 71 first to form the metal layer 81, then a dielectric layer covers the metal layer, and then a conductive channel is disposed in the dielectric layer. The conductive channel forms the metal post 82.

During preparation of the electromagnetic radiation suppression structures shown in FIG. 12 and FIG. 13, a metal layer may be deposited on the support frame 71 first to form the metal layer 81, then a dielectric layer covers the metal layer, and then a conductive channel is disposed in the dielectric layer. The conductive channel forms the metal post 82, then a metal layer is formed on the dielectric layer, and then the metal layer is patterned to form another metal layer 83. The structures shown in FIG. 9, FIG. 11, FIG. 12, and FIG. 13 may be referred to as periodic electromagnetic radiation suppression structures.

Figure 14:
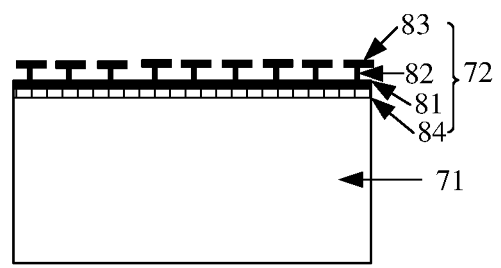
FIG. 14 is a schematic diagram of a structure including a support frame and an electromagnetic radiation suppression structure according to an embodiment of this application.

FIG. 14 is a structural diagram of another electromagnetic radiation suppression structure 72. The electromagnetic radiation suppression structure 72 includes the periodic electromagnetic radiation suppression structures shown in FIG. 1*i* and FIG. 12 and a wave-absorbing layer 84 made of an electromagnetic wave-absorbing material or a shield layer 84 made of an electromagnetic shielding material.

Refer to FIG. 14. The wave-absorbing layer 84 or the shield layer 84 is disposed on the support frame 71, and the periodic electromagnetic radiation suppression structure is located on the wave-absorbing layer 84 or the shield layer 84. The electromagnetic radiation suppression structure 72 formed in this way is a composite electromagnetic wave suppression structure. To be specific, the wave-absorbing layer 84 or the shield layer 84 has a suppression effect on an electromagnetic wave, and then the periodic electromagnetic radiation suppression structure absorbs a wave. This further improves an electromagnetic wave suppression effect.

The support frame 71 may be made of a metal material, for example, copper or iron, or may be made of a non-metal resin material.

When the support frame is made of a metal material, the metal support frame has a function of blocking an electromagnetic wave. In this way, the metal support frame 71 is combined with the electromagnetic radiation suppression structure 72, so that an electromagnetic wave radiation suppression effect can be further enhanced. Especially, when the chip package structure has a large height, and a distance between a heat sink and a PCB is long, the combined metal support frame and the electromagnetic radiation suppression structure 72 has a better electromagnetic suppression effect and a good warpage suppression effect.

FIG. 15, FIG. 16, FIG. 17, FIG. 19, FIG. 20, and FIG. 21 show a plurality of different manners of arranging the electromagnetic radiation suppression structure 72 on the support frame 71. In these structural diagrams, a first surface of the reinforcement structure 7 is close to the PCB 1, and a second surface of the reinforcement structure 7 is close to the heat sink 5.

Figure 15:
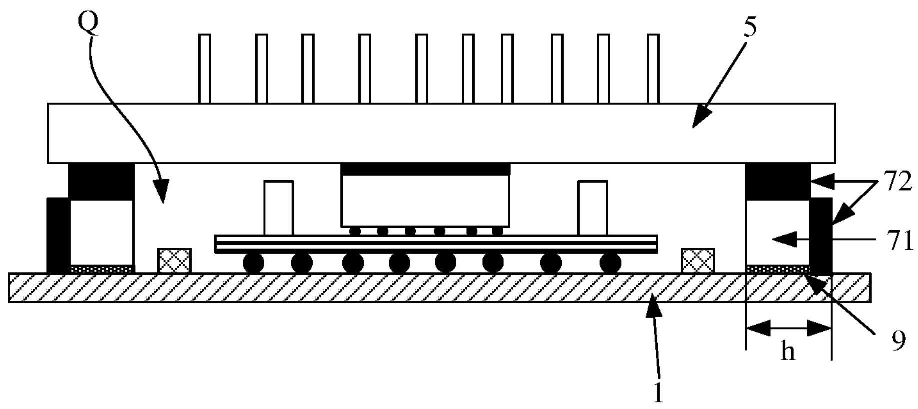
FIG. 15 is a schematic diagram of a partial structure of an electronic device according to an embodiment of this application.

In FIG. 15, the electromagnetic radiation suppression structure 72 is arranged on both the second surface and an outer surface of the support frame 71.

Figure 16:
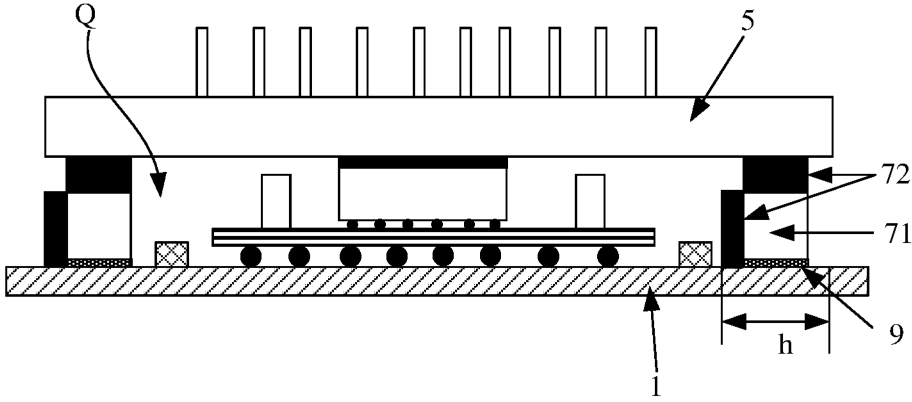
FIG. 16 is a schematic diagram of a partial structure of an electronic device according to an embodiment of this application.

In FIG. 16, the electromagnetic radiation suppression structure 72 is arranged on both the second surface and an inner surface of the support frame 71.

Figure 17:
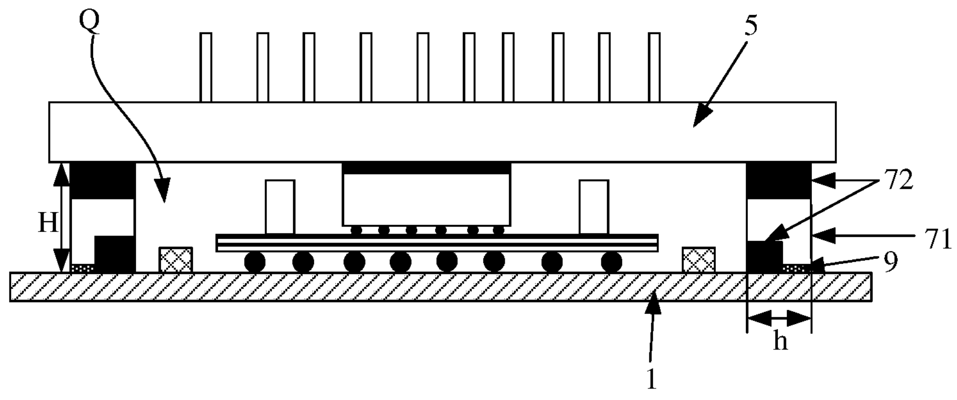
FIG. 17 is a schematic diagram of a partial structure of an electronic device according to an embodiment of this application.
Figure 19:
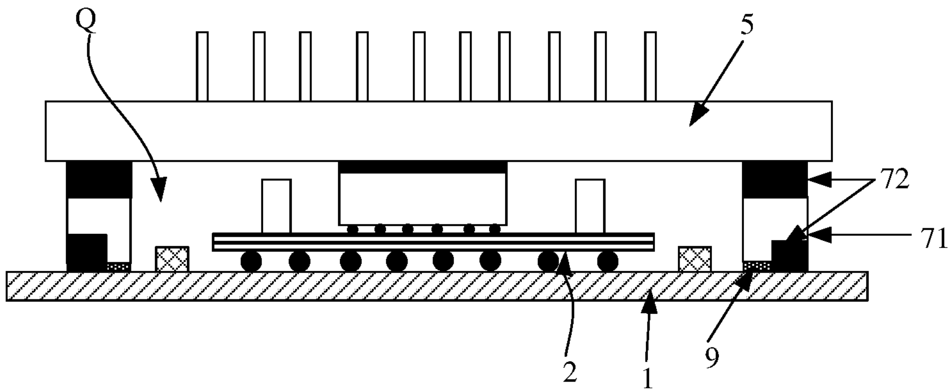
FIG. 19 is a schematic diagram of a partial structure of an electronic device according to an embodiment of this application.

In FIG. 17 and FIG. 19, the electromagnetic radiation suppression structure 72 is arranged on both the second surface and the first surface of the support frame 71.

Figure 20:
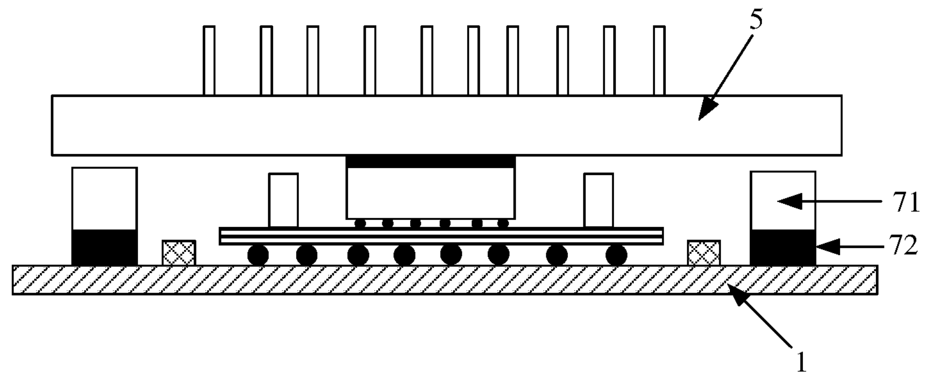
FIG. 20 is a schematic diagram of a partial structure of an electronic device according to an embodiment of this application.

In FIG. 20, the electromagnetic radiation suppression structure 72 is arranged on the first surface of the support frame 71.

Figure 21:
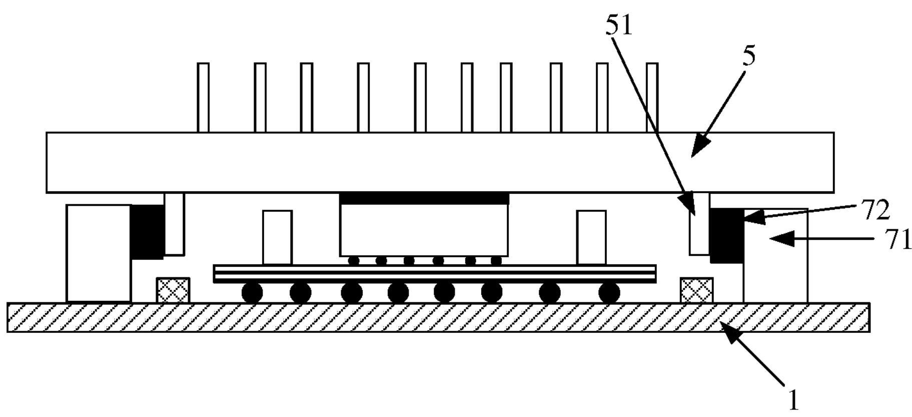
FIG. 21 is a schematic diagram of a partial structure of an electronic device according to an embodiment of this application.

In FIG. 21, the electromagnetic radiation suppression structure 72 is arranged on the inner surface of the support frame 71.

Certainly, the electromagnetic radiation suppression structure 72 may be arranged on another combination of the inner surface, the outer surface, the first surface, and the second surface.

When the electromagnetic radiation suppression structure is disposed on different surfaces of the support frame 71, electromagnetic waves are suppressed in different directions to improve a suppression effect.

Generally, a metal wiring is formed on a surface that is of the PCB 1 and that is used for carrying the chip package structure 2. When the support frame 71 is made of a metal material, to avoid an electrical connection between the support frame 71 and the metal wiring on the surface of the PCB 1. Refer to FIG. 15, FIG. 16, FIG. 17, and FIG. 19. An insulation layer 9 may be disposed at a position that is of the PCB 1 and that is used for carrying the support frame 71. The support frame 71 is disposed on the insulation layer 9, so that the metal support frame 71 is insulated from the PCB 1.

However, generally, the insulation layer 9 is made of a material, for example, polycarbonate or epoxy resin. These insulation materials have no electromagnetic radiation suppression function. In this way, space filled with the insulation layer 9 between the support frame 71 and the PCB 1 becomes a path along which an electromagnetic wave is radiated outside. To cut off the path, in FIG. 15 and FIG. 16, the electromagnetic radiation suppression structure 72 is disposed on the inner surface, or the outer surface, or the inner surface and the outer surface of the support frame 71, and the electromagnetic radiation suppression structure 72 on these surfaces protrudes from the first surface.

In FIG. 15, the electromagnetic radiation suppression structure 72 is far away from the chip package structure 2 than the insulation layer 9 is, in other words, is located on the outer surface of the support frame 71. In this way, after passing through the insulation layer 9, an electromagnetic wave radiated by the chip package structure 2 is suppressed by the electromagnetic radiation suppression structure 72, so that the electromagnetic wave is kept from being directly radiated through the insulation layer.

In FIG. 16, the electromagnetic radiation suppression structure 72 is closer to the chip package structure 2 than the insulation layer 9 is, in other words, is located on the inner surface of the support frame 71. In this case, an electromagnetic wave radiated by the chip package structure 2 is suppressed by the electromagnetic radiation suppression structure 72, and therefore is not radiated through the insulation layer 9.

Figure 18:
FIG. 18 is a sectional view of a support frame according to an embodiment of this application.

Refer to FIG. 17 and FIG. 18. FIG. 18 is a sectional view of the support frame 71 in FIG. 17. A concave cavity 10 is formed in a partial area of the first surface of the support frame 71 close to the PCB 1. A first portion of the electromagnetic radiation suppression structure 72 is disposed in the concave cavity 10, and the first portion of the electromagnetic radiation suppression structure 72 in the concave cavity 10 protrudes from the first surface. In FIG. 17, a second portion of the electromagnetic radiation suppression structure 72 is disposed on a top surface of the support frame 71. Compared with FIG. 15 and FIG. 16, on the premise of ensuring a good electromagnetic wave suppression effect, the structure shown in FIG. 17 may reduce a size of the reinforcement structure 1 in a direction h in the figure. In this way, the reinforcement structure 1 does not occupy a large quantity of positions on the PCB 1 to ensure integrity of other electronic components on the PCB 1.

In addition, compared with FIG. 17, as shown in FIG. 19, a concave cavity may be formed at a position in the first surface of the support frame 71 close to the PCB 1 and away from the chip package structure 2, and the electromagnetic radiation suppression structure 72 is disposed in the concave cavity.

In some other implementations, a concave cavity may be formed in the second surface of the support frame 71 close to the heat sink 5, and the electromagnetic radiation suppression structure 72 is disposed in the concave cavity. For example, when a wave-absorbing material is selected for the electromagnetic radiation suppression structure 72 located in the concave cavity, a gap may be allowed between the heat sink 5 and the electromagnetic radiation suppression structure 72. In another example, when an electromagnetic shielding material is selected for the electromagnetic radiation suppression structure 72 located in the concave cavity, the heat sink 5 needs to abut against the electromagnetic radiation suppression 72, so that the chip package structure 2 is located in a shielding cavity.

To further improve an electromagnetic radiation suppression effect, a height of the reinforcement structure is larger than or equal to a height of the chip package structure, and the height is a size in a direction from the first surface to the second surface. In this way, as shown in FIG. 15, FIG. 16, FIG. 17, and FIG. 19, a surface of the reinforcement structure facing the printed circuit board 1 abuts against the printed circuit board 1, and a surface of the reinforcement structure facing the heat sink 5 abuts against the heat sink 5, so that the chip package structure 2 is located in a closed cavity (for example, a Q cavity in the figure) defined by the reinforcement structure, the heat sink 5, and the printed circuit board 1.

When the support frame 71 is made of a metal material, and the electromagnetic radiation suppression structure 72 is made of an electromagnetic shielding material, the formed closed cavity is a closed shielding cavity. In this way, an electromagnetic wave radiated by the chip package structure 2 is completely blocked in the shielding cavity, and the electromagnetic wave is kept from being radiated to the outside of the electronic device.

Certainly, when the electromagnetic radiation suppression structure 72 is made of the wave-absorbing material, the chip package structure 2 may be located in a closed cavity defined by the reinforcement structure, the heat sink, and the printed circuit board. In this way, a leakage path of an electromagnetic wave can also be reduced, and an electromagnetic wave radiation suppression effect can be improved.

When an elastic electromagnetic shield layer or an electromagnetic wave-absorbing layer is selected for the electromagnetic radiation suppression structure 72, as shown in FIG. 19, the electromagnetic radiation suppression structure 72 may be arranged on an upper surface of the support frame 71 facing the heat sink 5, and the electromagnetic radiation suppression structure 72 abuts against the heat sink 5.

In this way, when a reliability risk test such as a package drop test is performed on the structure, because the heat sink 5 abuts against the elastic electromagnetic radiation suppression structure 72, the electromagnetic radiation suppression structure 72 may have a buffering effect for the heat sink 5, to keep the heat sink 5 from causing a large impact on the chip package structure 2, thereby protecting the chip package structure 2.

In FIG. 21, when the electromagnetic radiation suppression structure is arranged only on the inner surface of the support frame 71, and a distance exists between the second surface of the support frame 71 and the heat sink, a gap between the second surface of the support frame 71 and the heat sink 5 becomes a path along which an electromagnetic wave is radiated outside. To keep an electromagnetic wave from being radiated along the path, as shown in FIG. 21, a bump 51 may be disposed at a position of the heat sink 5 close to the support frame, and in addition, the bump 51 abuts against the electromagnetic radiation suppression structure 72. In this way, the gap between the second surface of the support frame 71 and the heat sink 5 is sealed, and the bump 51 connected to the heat sink 5 is generally made of metal, to suppress radiation of an electromagnetic wave.

It can be learned from the foregoing several example reinforcement structures that, when the reinforcement structure is disposed on the PCB and on a periphery of the chip package structure, according to a suppression frequency band of electromagnetic noise obtained through analysis, a height of the support frame may be determined, and a surface that is of the support frame and on which the electromagnetic radiation suppression structure is to be disposed may be determined, to suppress an electromagnetic wave in a frequency band of electromagnetic waves to be suppressed.

Figure 22:
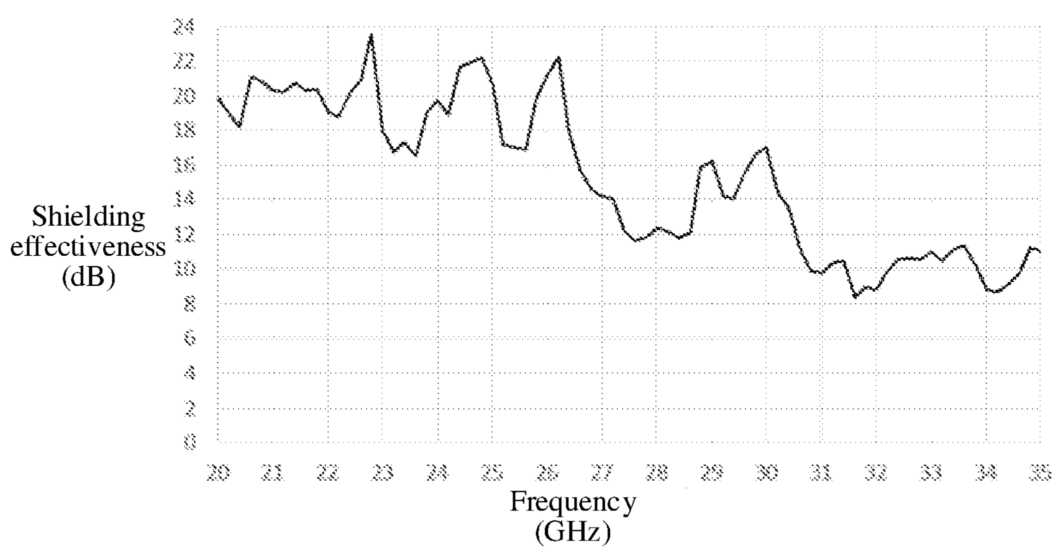
FIG. 22 is a test curve diagram of shielding effectiveness of an electronic device according to an embodiment of this application.

When the structure shown in FIG. 17 is used, an electromagnetic wave noise factor test for a chip with power consumption of 144 W and a maximum speed of 58 Gbps is provided below. In addition, a spacing H between the heat sink 5 and the PCB 1 is 5.75 mm. The support frame 71 is of a structure with a rectangular cross-section. The support frame 71 has a length of 92 mm, a width of 92 mm, and a height of 3.4 mm. The insulation layer has a height of 0.35 mm. The wave-absorbing layer on the second surface has a height of 1 mm. The wave-absorbing layer in the concave cavity in the first surface has a height of 0.5 mm. A curve in FIG. 22 is a curve of shielding effectiveness (Shielding Effectiveness, SE). It can be learned from the curve that, in a frequency range from 25 GHz to 30 GHz, the SE is above 10 dB. An electromagnetic radiation suppression effect is clearly improved compared with existing SE of approximately 4 dB.

In the descriptions of this specification, the described specific features, structures, materials, or characteristics may be combined in a proper manner in any one or more of embodiments or examples.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A reinforcement structure, comprising:

a support frame;

an accommodation chamber, defined by the support frame and extending through a first surface of the support frame and a second surface of the support frame that are opposite to each other, wherein the accommodation chamber is configured to accommodate a chip package structure disposed on a printed circuit board, wherein a wall surface of the support frame that faces the accommodation chamber is an inner surface, and a wall surface of the support frame opposite to the inner surface is an outer surface; and an electromagnetic radiation suppression structure disposed on the first surface, the second surface, the inner surface, or the outer surface, wherein a concave cavity is disposed in a partial area of the first surface, the concave cavity is disposed between the accommodation chamber and the inner surface of the support frame that faces the accommodation chamber, the electromagnetic radiation suppression structure is arranged in the concave cavity abutting the inner surface of the support frame that faces the accommodation chamber, and the electromagnetic radiation suppression structure in the concave cavity protrudes from the first surface.

2. The reinforcement structure according to claim 1, wherein the support frame is made of a metal material.

3. The reinforcement structure according to claim 1, wherein the electromagnetic radiation suppression structure comprises a shield layer made of an electromagnetic shielding material.

4. The reinforcement structure according to claim 1, wherein the electromagnetic radiation suppression structure comprises a wave-absorbing layer made of an electromagnetic wave-absorbing material.

5. The reinforcement structure according to claim 4, wherein the wave-absorbing layer is adhered to the support frame by a bonding layer; or the electromagnetic wave-absorbing material is directly disposed on the support frame to form the wave-absorbing layer.

6. The reinforcement structure according to claim 1, wherein a solid insulation layer is disposed on an area of the first surface of the support frame that is not part of the concave cavity, wherein the electromagnetic radiation suppression structure in the concave cavity abuts a side surface of the solid insulation layer that faces the accommodation chamber.

7. The reinforcement structure according to claim 1, wherein the electromagnetic radiation suppression structure in the concave cavity extends lower than the support frame.

8. An electronic device, comprising:

a printed circuit board;

a chip package structure on the printed circuit board;

a reinforcement structure comprising a support frame;

an accommodation chamber, defined by the support frame and extending through a first surface of the support frame and a second surface of the support frame that are opposite to each other, wherein the accommodation chamber is configured to accommodate the chip package structure, wherein a wall surface of the support frame that defines faces the accommodation chamber is an inner surface, and a wall surface of the support frame opposite to the inner surface is an outer surface; and an electromagnetic radiation suppression structure disposed on the first surface, the second surface, the inner surface, or the outer surface, wherein the chip package structure and the reinforcement structure are disposed on a same surface of the printed circuit board, wherein a concave cavity is disposed in a partial area of the first surface, the concave cavity is disposed between the accommodation chamber and the inner surface of the support frame that faces the accommodation chamber, the electromagnetic radiation suppression structure is arranged in the concave cavity abutting the inner surface of the support frame that faces the accommodation chamber, and the electromagnetic radiation suppression structure in the concave cavity protrudes from the first surface; and a heat sink covering a side of the chip package structure opposite to the printed circuit board.

9. The electronic device according to claim 8, wherein the first surface faces the printed circuit board and a solid insulation layer is disposed between the printed circuit board and an area of the first surface that is not part of the concave cavity.

10. The electronic device according to claim 8, wherein the support frame comprises a plurality of support subframes, the plurality of support subframes are arranged at intervals along a periphery of the chip package structure, and a spacing between two adjacent support subframes is a quarter of a wavelength corresponding to a frequency of an electromagnetic wave to be suppressed.

11. The electronic device according to claim 8, wherein a surface of the reinforcement structure facing the printed circuit board abuts against the printed circuit board, and a surface of the reinforcement structure facing the heat sink abuts against the heat sink, so that the chip package structure is located in a closed cavity defined by the reinforcement structure, the heat sink, and the printed circuit board.

12. The electronic device of claim 9, wherein the electromagnetic radiation suppression structure in the concave cavity abuts a side surface of the solid insulation layer that faces the accommodation chamber.

13. The electronic device of claim 9, wherein the solid insulation layer insulates the support frame from a metal wiring on a surface of the printed circuit board.

14. A reinforcement structure, comprising:

a support frame configured to be attached to a printed circuit board;

an accommodation chamber, defined by the support frame and extending through the support frame, wherein the accommodation chamber is configured to accommodate a chip package structure attached to the printed circuit board; and an electromagnetic radiation suppression structure, wherein a concave cavity is disposed in a partial area of a bottom surface of the support frame, the concave cavity is disposed between the accommodation chamber and a side surface of the support frame that faces the accommodation chamber, a first portion of the electromagnetic radiation suppression structure is arranged in the concave cavity abutting the side surface of the support frame that faces the accommodation chamber, and wherein the electromagnetic radiation suppression structure comprises a shield layer made of an electromagnetic shielding material or a wave-absorbing layer made of an electromagnetic wave-absorbing material.

15. The reinforcement structure of claim 14, wherein a second portion of the electromagnetic radiation suppression structure is disposed on a top surface of the support frame when the support frame is attached to the printed circuit board.

16. The reinforcement structure of claim 14, wherein the electromagnetic radiation suppression structure is disposed on the bottom surface of the support frame when the support frame is attached to the printed circuit board.

17. The reinforcement structure of claim 15, wherein the second portion of the electromagnetic radiation suppression structure has a same width as the support frame in a cross-sectional view.

18. The reinforcement structure of claim 14, wherein a solid insulation layer is disposed on an area of the bottom surface of the support frame that is not part of the concave cavity, and wherein the concave cavity is disposed between the solid insulation layer and the chip package structure when the support frame is attached to the printed circuit board.

19. The reinforcement structure of claim 18, wherein the first portion of the electromagnetic radiation suppression structure abuts against the solid insulation layer.

* * * * *